United States Patent [19]

Gilbert et al.

[11] 4,252,865

[45] Feb. 24, 1981

[54] HIGHLY SOLAR-ENERGY ABSORBING DEVICE AND METHOD OF MAKING THE SAME

[75] Inventors: Laurence R. Gilbert, State College; Russell F. Messier, Pennsylvania Furnace; Rustum Roy, State College, all of Pa.

[73] Assignee: National Patent Development Corporation, New York, N.Y.

[21] Appl. No.: 909,166

[22] Filed: May 24, 1978

[51] Int. Cl.³ .......................... H01L 31/00; F24J 3/02; C23C 15/00

[52] U.S. Cl. .................................. 428/611; 126/901; 136/256; 156/651; 156/662; 204/192 P; 204/192 S; 204/298; 428/620; 428/641; 428/333; 428/687; 428/913

[58] Field of Search .................. 204/192 P, 192 S; 136/89 CC; 428/446, 450, 141, 620, 641, 611, 333, 913, 687; 427/160, 74, 82; 357/2; 156/662, 651, 654; 126/901

[56] References Cited

U.S. PATENT DOCUMENTS 4,137,123  1/1979  Bailey et al. .......................... 156/647

FOREIGN PATENT DOCUMENTS 751084  1/1967  Canada ..................................... 136/89

OTHER PUBLICATIONS

Wronski et al., Schottky-Barrier Characteristics of Metal-Amorphous-Silicon Diodes, *App. Phys. Lett.*, 29 (1976), p. 602.
Promotional Bulletin of KTA Products Division, NPD Energy Systems, Inc. of Rockville, Maryland.
Hahn et al., Thick Semiconductor Films for Photothermal Solar Energy Conversion, *J. Vac. Sci. Technol.*, 12 (1975), p. 905.
Cuomo et al., A New Concept for Solar Energy Thermal Conversion, *App. Phys. Lett.* 26 (1975), p. 557.
Peterson et al., Thin Film Coatings in Solar-Thermal Power Systems, *J. Vac. Sci. Technol.*, 12 (1975), p. 174.
Gittleman et al., Optical Properties and Selective Solar Absorption of Composite Material Films, *Thin Solid Films*, 45 (1977), p. 9.
T. D. Moustakas et al., Preparation of Highly Photoconductive Amorphous Silicon by RF Sputtering, *Solid State Communications*, vol. 23, No. 3, pp. 155-158.
Richard W. Griffith, Solar Energy Utilization . . . A High Efficiency Amorphous-Silicon Absorber, Conference Record-Solar Technology in the Seventies, vol. 6, Photovoltaics, pp. 205-215.
K. W. Boer, The Solar Spectrum at Typical Clear Weather Days, *Solar Energy*, vol. 19, pp. 525-538.
W. Paul et al., Doping, Schottky Barrier and P-N Junction Formation in Amorphous Germanium and Silicon, *Solid State Communications*, vol. 20, No. 10, pp. 969-972.

*Primary Examiner*—Aaron Weisstuch
*Assistant Examiner*—William Leader
*Attorney, Agent, or Firm*—Hopgood, CAlimafde, Kalil, Blaustein & Lieberman

[57] ABSTRACT

The invention contemplates a highly solar-energy absorbing device wherein the surface exposed to incident solar energy is a particularly characterized roughness of an amorphous semiconductor material, the particular characterization being that of an array of outwardly projecting structural elements of relatively high aspect ratio and at effective lateral spacings which are or include those in the order of magnitude of wavelengths within the solar-energy spectrum.

34 Claims, 12 Drawing Figures

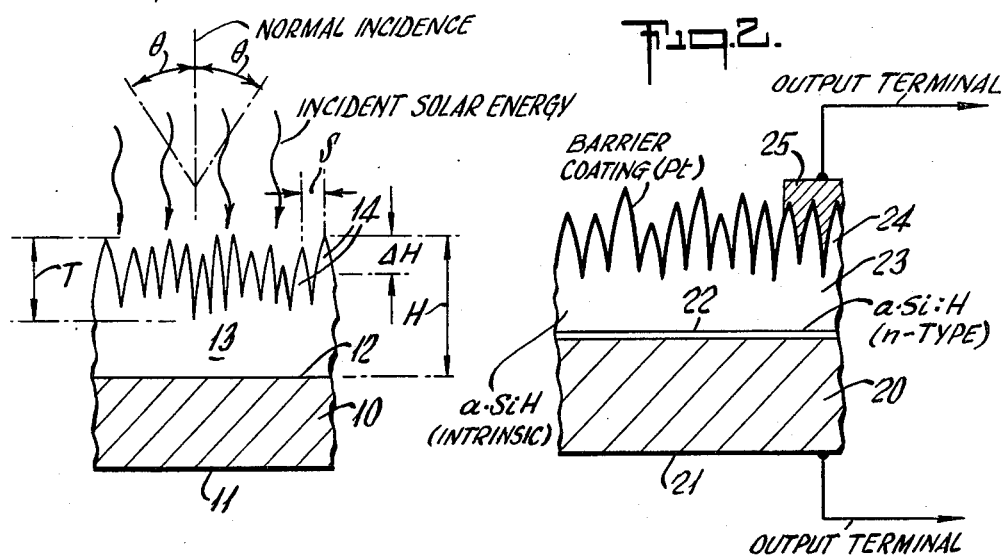
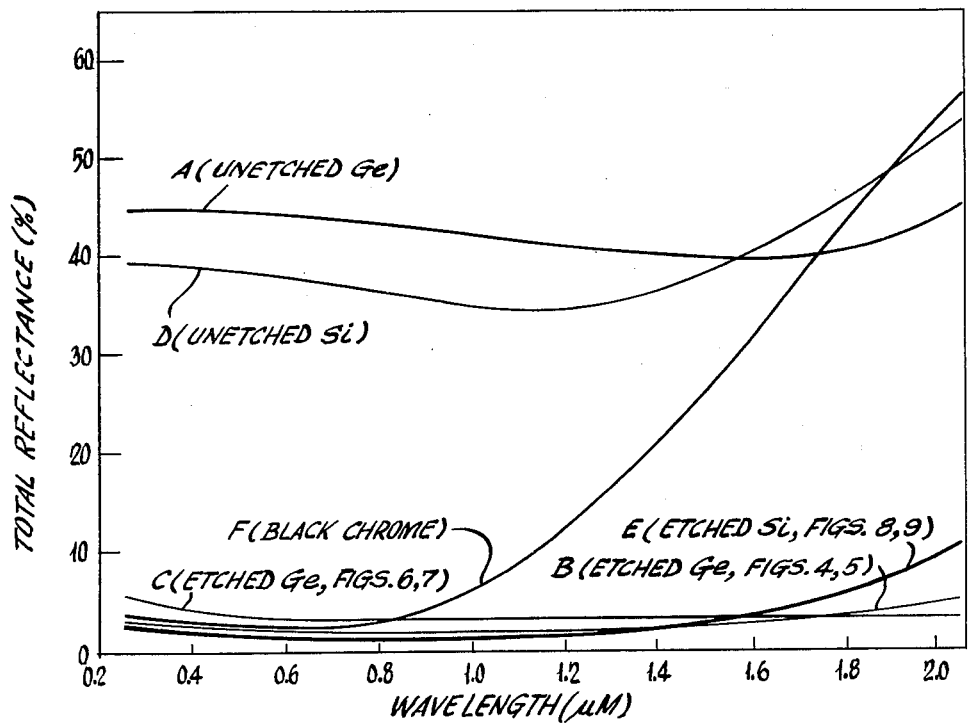

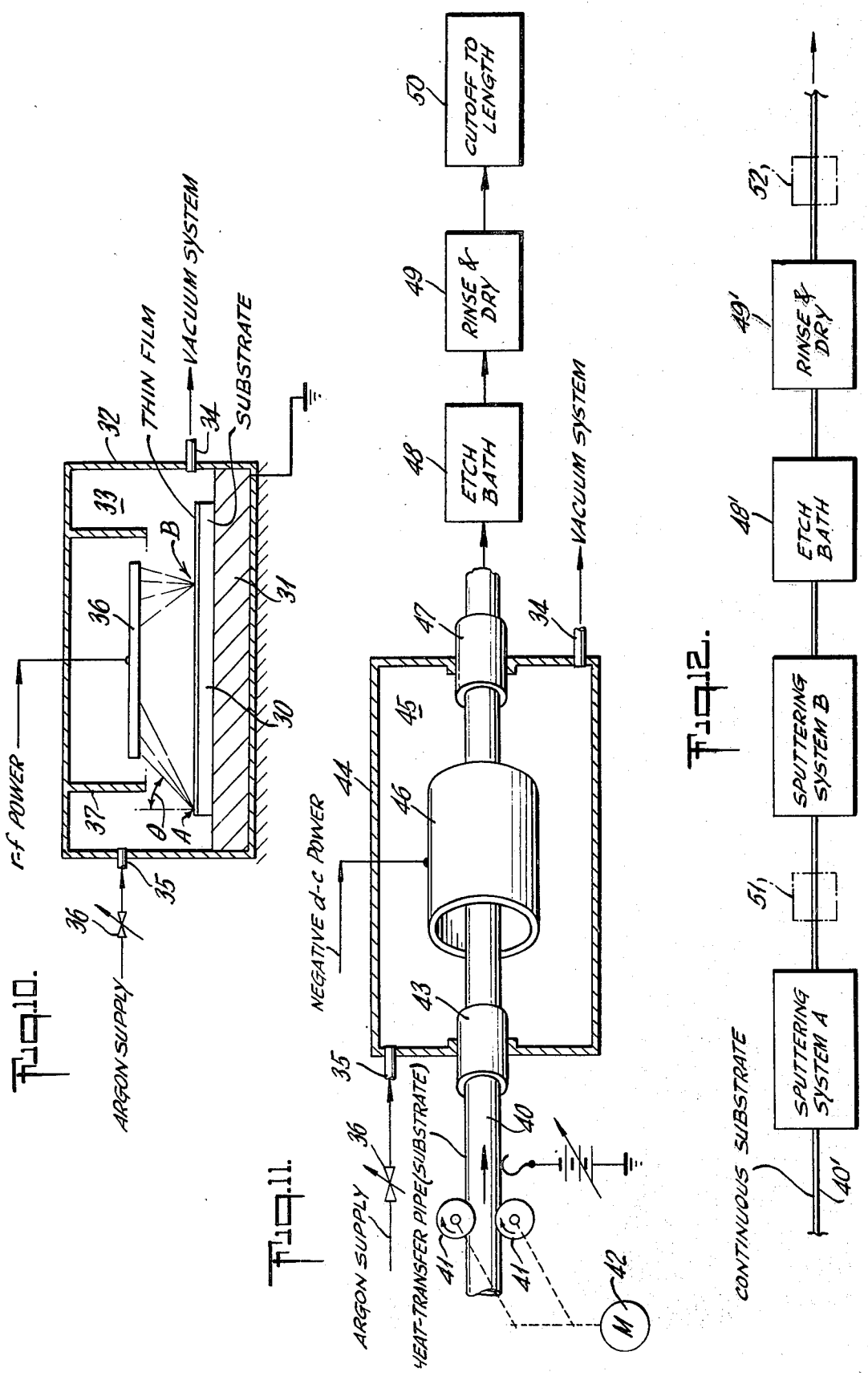

HIGHLY SOLAR-ENERGY ABSORBING DEVICE AND METHOD OF MAKING THE SAME

This invention relates to structure and a technique for enhancing the solar-energy absorbing properties of semiconductor material and in particular amorphous semiconductor material, particularly for photothermal and/or photovoltaic end-use purposes.

An ideal selective solar absorber surface would absorb all incident solar radiation and not re-radiate any of the photothermally converted energy. However, in the presently illustrative photothermal or photovoltaic applications, the temperature range of interest may be generally stated at 350° to 1000° K., and due to the overlap of the solar spectrum with the radiation spectrum of a warm body in this temperature range, no single layer can be ideal. The ideal solar absorber surface is usually considered to be one which has zero reflectivity at wavelengths less than that at which the solar and warm-body radiation spectra are equal, and 100 percent reflectivity at longer wavelengths. Metal films and semiconductor-metal-tandem films [Hahn et al., "Thick Semiconductor Films for Photothermal Solar Energy Conversion," J. Vac. Sci. Technol. 12 (1975) 905] are both highly absorbing in the visible and highly reflecting in the infrared and, as such, are prime candidates as selectively operating surfaces. However, they are also highly reflecting in the visible. Various schemes have been used to reduce such reflectivity, including surface-roughening [Cuomo, et al., "A New Concept for Solar Energy Thermal Conversion", App. Phys. Lett. 26 (1975) 557], anti-reflection top coatings [Peterson et al., "Thin Film Coatings in Solar-Thermal Power Systems," J. Vac. Sci. Technol. 12 (1975) 174]; cermet films [Gittleman et al., "Optical Properties and Selective Solar Absorption of Composite Material Films," Thin Solid Films 45 (1977) 9]; and combinations of these schemes. The most successful such metal product to date is electro-deposited black chrome*. But these and other past techniques of which we are aware fall short of reducing solar-energy reflectivity to truly insignificant levels, for the entire or for substantially the entire solar-energy spectrum.

*Commercially available under the mark "Solarstrip," from Berry Solar Products, Edison, New Jersey.

It is, accordingly, an object of the invention to provide improved structure and technique for substantially improving solar-energy absorbing properties in a context of the character indicated.

It is also an object to achieve the foregoing objects with structures and techniques that are subject to precise specification and reproduceability, to achieve specified performance.

A specific object is to provide an anti-reflective surface structure which is inherently absorbent to most of the solar-energy spectrum, to the extent of at least 95 percent.

Another specific object is to achieve the previous specific object, for at least a portion of an externally exposable surface of an amorphous semiconductor.

A further specific object is to provide an amorphous semiconductor surface with a surface-roughness on the order of the wavelength of light and having a high aspect ratio, namely, a high ratio of height to width of the individual projections which characterize the surface-roughness.

Still another object is to provide such an energy-absorbing surface-roughness structure which remains high in its selective absorption of solar energy, for a wide range of incidence inclination with respect to a normal to the treated surface; still more specifically, it is also an object to provide such a wide range of absorbent incidence angles, wherein the center of the wide range is selectively normal, or inclined to a normal, to the treated surface.

A general object is to meet the above-stated objects with structure and techniques having a relatively wide variety of different specific applications, including but not limited to photothermal and photovoltaic applications.

Other objects and various further features of novelty and invention will be pointed out or will occur to those skilled in the art from a reading of the following specification in conjunction with the accompanying drawings. In said drawings, which show, for illustrative purposes only, preferred embodiments of the invention:

FIG. 1 is a simplified and greatly enlarged fragmentary vertical sectional view of a photothermal device featuring highly solar-energy absorbing surface microstructure of the invention;

FIG. 2 is a view similar to FIG. 1 to illustrate a photovoltaic embodiment of the invention;

FIG. 3 is a graphical presentation of total reflectance (i.e., specular plus diffuse) as a function of wavelength throughout the spectrum which applies for incident solar energy, total reflectance being plotted as a percentage of energy incident normal to the exposed surface;

FIG. 10 is a simplified diagram to illustrate apparatus used in one of the procedural steps of the inventive method as applied to controlled surface morphology of a flat surface;

FIG. 11 is a similar simplified diagram to show application of the invention to a cylindrical surface; and FIG. 12 is a further simplified diagram to illustrate employment of a more complex surface-morphology procedure.

Figure 4:
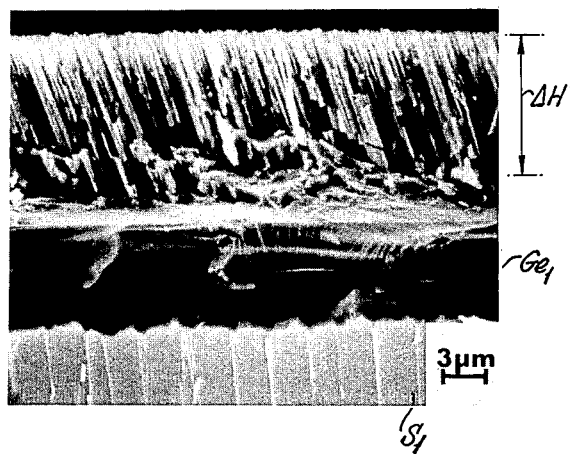
FIGS. 4 through 9 are scanning electron microscope photographs for which the applicable degree of magnification is shown by scale legend at the lower-right corner of each photograph, the photographs being taken in successive pairs for each of three different amorphous semiconductor materials, each of which is characterized by controlled surface morphology of the invention.
Figure 5:
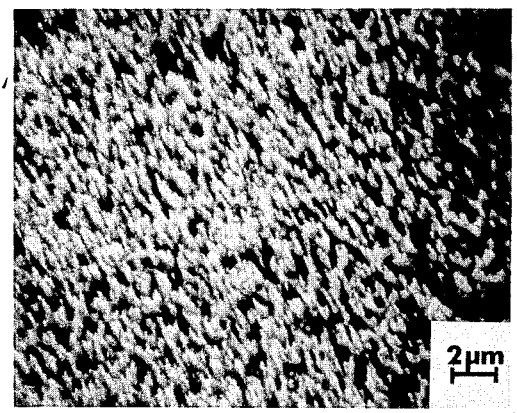

Our invention proceeds from our initial observation that amorphous (i.e., non-crystalline) germanium* films prepared under certain sputtering conditions will turn black under visual observation when etched in hydrogen peroxide. The blackness has been measured and determined as representing a drastic decrease in total surface reflectance, namely, from 45 percent to less than 3 percent, due to a surface-roughness microstructure which develops during etching and which is a function of the etching procedure as well as a function of the technique of initial preparation of the film. We have noted, for example, that the range of sputtering conditions over which such black films are attained is quite wide, resulting in variations in surface microstructure details and also in reflectance spectra which depend on the sputtering conditions. In general, the surface roughness is on the order of the wavelength of light and has a high aspect ratio. And we have found the invention to be applicable to amorphous semiconductor materials other than non-crystalline germanium; in particular, noting that germanium is tetrahedrally bonded, we have found that the invention is applicable to other tetrahedrally bonded amorphous semiconductors such as non-crystalline silicon.

*Sometimes referred to as "NC Ge."

Referring to FIG. 1, the invention is shown in application to a photothermal device, for exposure to solar energy which is incident in the general direction indicated by legend, wherein a substrate 10 may be of metal and is all or part of the wall or conduit over which or through which a liquid flows for extraction of heat via the inner surface 11. The external or exposure surface 12 is coated with a deposited body 13 of amorphous semiconductor material. The body 13 may be of thin-film proportions and it may be deposited on substrate 10 as by glow-discharge decomposition; however, in the presently preferred structures and techniques of the invention, the body 13 is deposited by sputtering, as will later more fully appear. In the form shown, the outer or exposure surface of body 13 is an etched surface characterized by a dense array of acicular (needle-like) projecting formations 14, the physical dimensions and proportions of which are important to the highly solar-energy absorbing properties of the device. Specifically, the acicular formations 14 are of relatively high aspect ratio; as a practical matter, their aspect ratio should be in the range from 2:1 to 10:1, being preferably at least 3:1. Formations 14 are randomly distributed and are densely arrayed, to the extent that at least a substantial fraction of their number is at axial spacings on the order of wavelengths within the solar-energy spectrum, namely, in the range 0.2 to 2.0 microns; a typical such axial spacing is identified by the dimension S between two adjacent formations 14 at the section plane of FIG. 1. Formations 14 are also randomly distributed as to the extent of their peak elevation H with respect to surface 12, the range of variation in peak elevation being designated $\Delta H$ in FIG. 1. In view of the indicated wavelength proportions and dimensions, the array of formations 14 presents to the incident solar energy the appearance of layer of thickness T through which the index of refraction gradually builds to the relatively high level of approximately 4 which characterized the unetched region of the amorphous semiconductor body 13, so that the possibilities for any reflection are reduced to insignificant levels while incident energy is almost totally absorbed. We have also found that such reduction in reflection (and attendant substantial increase in the ability to absorb) applies for a relatively wide angular spread $\theta$ of the direction of incidence, for any inclination or such incidence from a normal to surface 12; the angle $\theta$ is observed to be at least 30 degrees, with immaterial degradation of absorbing properties, and in fact $\theta$ can be as much as 60 degrees before any visible reflection is noted.

FIG. 2 serves to illustrate the invention in application to a photovoltaic device, the particular embodiment shown being a Schottky-barrier type of device wherein certain features will be recognized from FIG. 1. Thus, the device of FIG. 2 is built upon a metal substrate 20 which is relied upon for one of the electrical output terminal connections. Substrate 20 may be of stainless steel, with a lower or inner surface 21 which may or may not be exposed to liquid flow, depending upon whether the device is to be both photovoltaic and photothermal, or purely photovoltaic. For electrical base contact with the amorphous semiconductor body 23, and for the case of body 23 being a sputtered deposit of intrinsic amorphous silicon (e.g., Si:H), the upper exposure surface 22 of substrate 20 is shown by legend to be coated with a very thin layer of n-type amorphous Si:H with a doping impurity component* of thickness on the order of 200 Å, the thickness of body 23 being on the order of 1 micron. The exposure surface of body 23 is an etched surface having the dense array of projections 24, as already described at 14, thus rendering the exposure surface of body 23 highly solar-energy absorbent. A thin metal coating over the absorbent surface is suggested by legend and by heavy-line rendition of the profile of surface projections 24 and will be understood to provide a Schottky barrier over the exposed surface area of all projections 24; such a barrier coating is of thickness very much less than the shortest wavelength in the solar spectrum, being illustratively on the order of 100 Å. Finally, the second electrical-output terminal is served by a plurality of spaced metal grid bars 25, as of aluminum or copper, the same being understood to be in parallel spaced array and electrically interconnected, as at a lateral edge of the array; bars 25 may be on the order of a fraction of a millimeter wide and 1 micron thick, as dictated by their current-handling requirements, and to be at spacings on the order of 1 millimeter, for favorable reception of carriers over the entire absorptively characterized exposure surface of the device.

*For detail of such doping and related amorphous semiconductor body construction, see Wronski et al., Schottky-Barrier Characteristics of Metal-Amorphous-Silicon Diodes, App. Phys. Lett. 29 (1976) 602.

For a better understanding of the surface morphology involved in the present invention, we shall describe illustrative examples, wherein etched-surface specimens were prepared and examined for each of three differently prepared materials; the solar-energy absorbing capabilities of the etched surface of each of these materials are apparent from their strikingly low reflectance of such energy, as plotted in FIG. 3, in comparison with unetched specimens of the same materials. For each of the etched specimens, two photomicrographs are presented at FIGS. 4 to 9.

EXAMPLE ONE

A sputtered thin film of amorphous germanium was deposited on a substrate in the form of a glass microscope slide, using a planar radio-frequency (r-f) diode sputterng system, schematically shown in FIG. 10. In this system, a flat substrate 30 is supported on a base 31, which is shown electrically grounded, and which defines with an upper envelope 32 a sealed chamber 33, the gaseous contents of which are continuously exhaused by a vacuum system at 34. The only leak into chamber 33 is a low flow of argon gas at 35, via a valve 36 which is adjustable to achieve a desired leak flow. Within chamber 33 and at a predetermined offset above and parallel to substrate 30, a germanium target 36 was fixedly positioned (by means not shown) and an r-f power connection was made to the target, the same being peripherally shielded by means 37 carried by envelope 32. The substrate 30 had a greater spatial extent than the sputtering target 36; this being the case, film deposited at a point A near the substrate margin results from vapor species impinging the substrate at acute incidence angle values ($\theta$) which are relatively substantial, while film deposited at point B beneath the target results from vapor species impinging the substrate at much lesser values of $\theta$, being in a substantially vertical direction, on the average. The surface-roughness of the later-etched upper surface of the deposited thin film is noted to have an orientation which can be generally correlated with the average value of the impinging incidence angle $\theta$, namely, unidirectionally acute in the region A, and generally vertical in the region B, with intermediate orientations between regions A and B depending inter alia upon the geometric relationship of the target and any particular region of the substrate and its developing amorphous germanium, identified in FIG. 10 merely by the legend "Thin Film".

More specifically, using apparatus as in FIG. 10, an NC Ge thin film was deposited on the glass-slide substrate 30 under the following conditions:

Gas pressure: $20 \times 10^{-3}$ Torr of argon

Power to Ge target material: 1 watt $cm^{-2}$ at 13.56 MHz*

Target-to-substrate spacing: 26 mm.

*I.e., in the frequency band assigned by the Government for scientific use.

Both the top surface and cross-section of the as-deposited film were smooth and featureless, and the top surface had an average total solar reflectance, under near-normal incidence, of approximately 45 percent (see FIG. 3, Curve A). The thin-film specimen was then placed in a hydrogen-peroxide (30% $H_2O_2$) etch-bath, and was visually observed to turn black after approximately one minute in the etch-bath. The specimen was removed from the etch-bath after eight minutes, and then water-rinsed and dried.

To examine the cross-section of the etched specimen, the substrate and its etched film were fractured, and observed by a scanning electron microscope (SEM). SEM photomicrographs for this specimen are presented in FIGS. 4 and 5, being a generally frontal aspect of the fracture section, and a plan aspect, respectively; the applicable scale is shown by legend at the lower-right corner of each photograph. The acicular character of projections in the microstructure of the etched surface appears from the photographs, consistent with the generalized discussion above in connection with FIG. 2, and these projections are densely packed. In FIG. 4, we have identified the substrate (at $S_1$) and the unetched remainder of the film body (at $Ge_1$). We also note that the height ($\Delta H'$) of the etched projections is a direct function of exposure time in the etch-bath, and that a preferred lesser height is achieved by using less etch-bath exposure time, e.g., 4 minutes, for the indicated strength of the etchant. Finally, it is noted that FIG. 4 reveals the near-normal but inclined orientation discussed above as to the incidence angle $\theta$; and the measured total reflectance, averaging approximately 3 percent over the solar-energy spectrum, is plotted as Curve B of FIG. 3.

EXAMPLE TWO

An amorphous thin film of NC Ge was prepared on a glass microscope slide by sputtering as described for Example One, except at twice the target-to-substrate spacing, namely at a spacing of 52 mm. Both the top surface and the cross-section of the as-deposited film were smooth and featureless, and the top surface had an average total solar reflectance of approximately 45 percent, as shown at Curve A, FIG. 3. The thin-film specimen was then placed in a hydrogen-peroxide (30% $H_2O_2$) etch-bath, and was visually observed to turn black after about 2 minutes in the etch-bath. The specimen was removed from the etch-bath after eight minutes, and then water-rinsed and dried.

Figure 6:
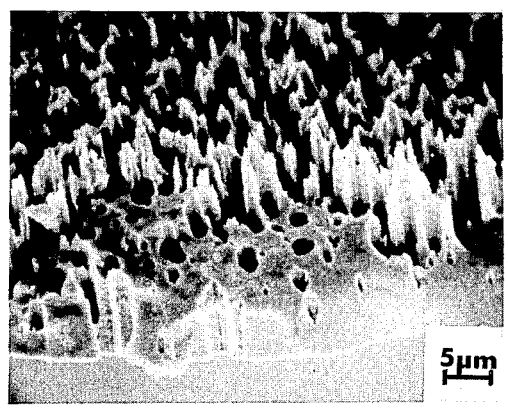
Figure 7:
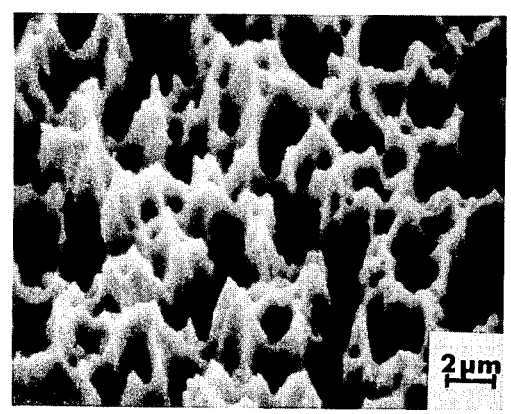

SEM examination and photography were pursued after fracture of the specimen, a larger-scale perspective aspect of the Ge body and etched-surface microstructure being in the micrograph of FIG. 6, and a smaller-scale (more enlarged) perspective aspect of merely the top-surface microstructure being depicted in the micrograph of FIG. 7. The etched surface is revealed as a dense array of interpenetrating and mutually reinforcing generally conical pits, wherein said pits are of randomly distributed depth and wherein the axial spacing between pits of greatest depth does not substantially exceed the wavelength of the infrared end of the solar-energy spectrum, and also wherein the axial spacing between pits of lesser depth within said random distribution necessarily includes a random distribution of axial spacings of smaller pits at solar-energy wavelengths. The more random distribution of more widely varying projections in the "pits" microstructure of Example Two, as compared with the "needes" microstructure of Example One, appears to account for the more nearly flat low reflectance characteristic which was measured for the described "pits" specimen of Example Two; see Curve C of FIG. 3 for the observed total reflectance of the "pits" microstructure, at approximately the 4 percent level.

EXAMPLE THREE

An amorphous thin film of silicon (NC Si) was prepared on a glass microscope slide by sputtering under the following conditions:

Gas pressure: $30 \times 10^{-3}$ Torr of argon

Power to Si target material: 2.5 watts $cm^2$ at 13.56 MHz

Target-to-substrate spacing: 32 mm

Both the top surface and the cross-section of the as-deposited Si film were smooth and featureless, and the top surface had an average total solar reflectance of approximately 40 percent, as shown at Curve D, FIG. 3. The thin-film NC Si specimen was then placed in an etch-bath consisting of a mixture of hydrogen fluoride, nitric acid and water, in the proportions by volume of 10:1:1, and was visually observed to turn black after about one minute in the etch-bath. The specimen was removed from the etch-bath after five minutes, and then water-rinsed and dried.

Figure 8:
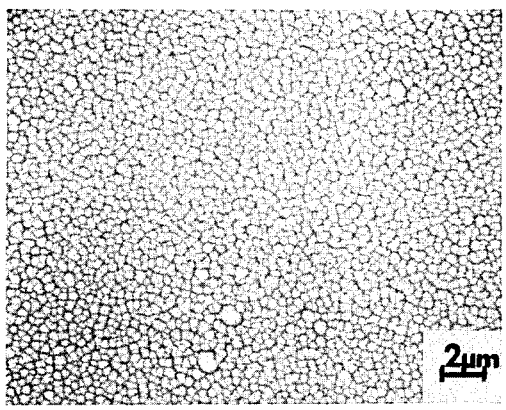
Figure 9:
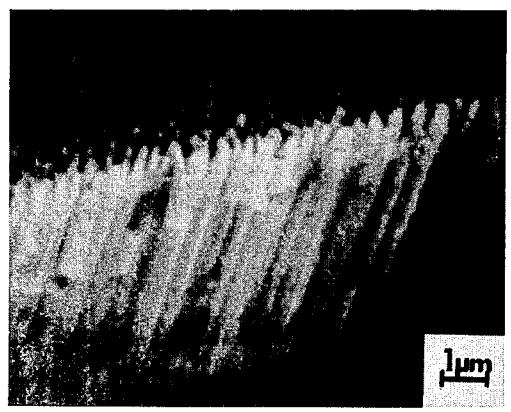

SEM examination and photography followed fracture of the etched specimen, as described for the other examples, and the applicable micrographs of FIGS. 8 and 9, are for generally plan and elevational aspects, respectively. The etched surface is revealed as a dense array of acicular formations of high aspect ratio and randomly distributed height, wherein the random lateral offset between axes of adjacent acicular formations is on the order of wavelengths within the solar-energy spectrum. Reflectance measurements for near-normal incidence of solar energy upon the etched Si specimen are plotted at Curve E of FIG. 3 and reveal an average total reflectance of approximately 3 percent over the solar spectrum, similar to the etched-Ge case of Example One, Curve B.

Thus far, the description has concerned itself with the microstructure and highly absorbent (i.e., non-solar-reflecting) properties of etched exposed amorphous semiconductor surfaces which, for simplicity, have been considered as somewhat limited flat areas, being samples prepared on a microscope slide or the like. But the invention will be understood to be applicable in much larger surface-area contexts, as when the substrate surface which is opposite the etched-NC semiconductor surface is to be used for heat transfer to a flowing liquid which carries heat to another location. For example, we schematically illustrate in FIG. 11 apparatus for the continuous production-line sputter-coating of the full outer cylindrical surface of a heat-transfer pipe or tube 40 which is thereafter passed through an etch bath as part of the same continuous process. The substrate 40 may for example be a hard-drawn copper tube of ½-inch O.D. of the type used in photothermal apparatus, as described in the current promotional bulletin of KTA Products Division, NPD Energy Systems, Inc., of Rockville, Md.

In FIG. 11, feed rolls 41 driven by motor means 42 continuously advance the tubular substrate 40 to and through vacuum-seal means 43 forming part of an envelope 44 which defines a sputtering chamber 45, corresponding to the chamber 33 of FIG. 10. Chamber 45 is served by a vacuum system and argon-leaking supply system, as described for FIG. 10 and therefore identified by the same reference numbers 34-35-36. However, the semiconductor target 46 is a hollow cathode, being a cylindrical annulus, sized and positioned (by means not shown) for uniform radial spacing from the tubular substrate which is conveyed therethrough. After sputtering exposure, the coated substrate exits from chamber 45 via further vacuum-seal means 47, and thence to an etch bath 48 of size and strength appropriate to the feed rate, for the particular semiconductor coating and absorbent surface desired; subsequent steps of rinsing, drying, and cut-off to desired length are indicated at 49–50. The power source for sputtering may be of the r-f variety indicated in FIG. 10, but we show in FIG. 11 the use of d-c power, for example at −2000 volts, grounded directly (or with selectively variable bias) via wiping contact with tube 40, at entry to chamber 45. Based on our experience, a sputtering-deposition rate of 2000 Å per minute is reasonable for building a germanium film of 1-micron thickness upon the tubular substrate 40, using a target 46 that is 0.5-meter long, and with a substrate feed rate of 2.5 meters per minute.

FIG. 12 illustrates that the technique of continuous production of etched NC semiconductor material lends itself to more complexity and sophistication in the development of the final solar-energy absorptive surface. In FIG. 12, the substrate 40' which is continuously fed to and through a sputtering system A may be as described for FIG. 11, namely, tubular drawn copper, and the schematic designation "Sputtering System A" may be as described in FIG. 10 for the envelope 44 and its operative contents and adjuncts. However, FIG. 12 illustrates that before etch-bath exposure at 48' the substrate treated at sputtering system A may be further coated by sputtering at "Sputtering System B", the parameters of sputtering at A and B being selected for optimized development of the ultimately etched surface. Alternatively, as suggested by phantom outline at 51, a first etch-rinse-and-dry cycle may be performed between exposure to System A and to System B sputtering. And, still further alternatively, a further phantom outline at 42 will be understood to suggest a final annealing step to develop partial or total crystallization of the etched amorphous semiconductor material, thus providing a higher temperature of operability for the finished product.

It will be seen that we have described highly solar-energy-absorbing surface microstructure for non-crystalline semiconductor materials, meeting all the above-stated objects. In every specific case, the prepared amorphous thin films happened to be of single elemental material, but it is known that sputtering techniques can be employed to deposit amorphous bodies of mixed elemental materials, so that, for example, the invention is to be understood to be applicable to such deposited mixtures in varying proportions of NC Si and NC Ge, to achieve particular properties among which is the selective solar absorption attributable to a suitably etched exposure surface of the amorphous deposit. Among the mixtures that may be deposited to advantage are those in which the added element or elements are selected for purely chemical or electronic-doping purposes (e.g., if deposited by sputtering, using an argon-hydrogen reactive sputtering gas, to embody hydrogen in the deposited layer of amorphous semiconductor; or if deposited by glow-discharge, then using silane or germane, as the case may be, to embody hydrogen in the deposited layer of amorphous semiconductor), or those in which the added element or compound is selected for its property of becoming a uniformly distributed crystalline or other deposit suspended in the primarily amorphous remainder of the thin-film body. In either event, the additive substance can provide a utilizable property in the etched-surface microstructure. Thus, by optimizing chemical composition or materials mixture with a given principal semiconductor material, it should be possible to obtain a morphology which is even more absorbent than those reported for the etched surfaces of FIG. 3.

Quite aside from the mixed or doped amorphous semiconductor deposits to which the invention is applicable, it will be understood that the deposition may be created other than by r-f sputtering, as for example, d-c sputtering, substrate-bias sputtering, evaporation, and glow-discharge decomposition.

We believe it important and unique to the invention that we have disclosed etched amorphous semiconductor materials wherein the projections which characterize the etched surface can be reproducibly controlled and varied from distances on the order of 0.2 micron, i.e., less than the wavelength of the solar-spectrum maximum (5000 Å at 6000° K.), to greater distances, up to 6 microns. Still further on the subject of controllability, the invention permits construction of highly absorbent amorphous semiconductor surfaces, on a custom basis, e.g., custom in the sense that bandgap shift as a function of design operating temperature can be anticipated and utilized, by selecting a particular material or combination of materials for their bandgap characteristic.

While, as noted, detailed discussion herein has been somewhat limited to amorphous silicon and amorphous germanium, it will be understood that quite different amorphous semiconductor elements and compounds may be particularly suited for special-purpose application. For example, cadmium telluride and gallium arsenide appear as attractive candidates for use of the invention in photovoltaic applications.

While the invention has been described in detail for preferred structures and methods, it will be understood that modifications may be made without departing from the scope of the invention.

What is claimed is:

1. A highly solar-energy absorbing device comprising an amorphous semiconductor body having at least one etched surface characterized by an array of oriented acicular structures, wherein the distance between adjacent structures is within or near the solar-energy wavelength or wavelengths to be absorbed.

2. An energy-absorbing device that is highly absorbent of energy incident in a particular direction and in a particular and limited spectral range, comprising an amorphous semiconductor body having an etched surface adapted to be exposed to such energy incidence, said surface being characterized by an array of acicular structures having spaced axes such that at least a substantial fraction of said structures are at an axis-to-axis lateral offset between adjacent acicular structures which offset is in the order of magnitude of wavelengths within the solar-energy spectrum.

3. The device of claim 2, in which said acicular structures are of randomly distributed axial extent.

4. The device of claim 2, in which the aspect ratio of said acicular structures is in the range of 2:1 to 10:1.

5. The device of claim 2, in which the aspect ratio of said acicular structures is greater than 3:1.

6. A highly solar-energy absorbing device, comprising an amorphous semiconductor body having at least one etched surface characterized by an array of interpenetrating generally conical pits, wherein said pits are of randomly distributed depth and wherein the spacing between pits of greatest depth does not substantially exceed the wavelength of the infrared end of the solar-energy spectrum, whereby the axial spacing between pits of lesser depth within said random distribution necessarily includes a random distribution of spacings of smaller pits at solar-energy wavelengths.

7. A highly solar-energy absorbing device, comprising a substrate having a supporting surface, a sputtered amorphous semiconductor body united to and covering at least a portion of said surface, said body having an etched outer surface substantially characterized by an array of outwardly projecting structural elements of aspect ratio within the range 2:1 to 10:1 and at lateral spacings at least a substantial fraction of which are in the order of magnitude of wavelengths within the solar-energy spectrum.

8. The device of claim 7, in which said projecting structural elements are acicular.

9. The device of claim 7, in which said projecting structural elements are of randomly distributed peak elevation with respect to the unetched body material to which they are integrally connected.

10. The device of claim 7, in which said projecting structural elements are defined by intersecting walls of an array of interpenetrating generally conical pits.

11. The device of claim 7, in which said body includes tetrahedrally bonded amorphous material as an essential component.

12. The device of claim 7, in which said body is of tetrahedrally bonded amorphous material selected from the group including non-crystalline germanium and non-crystalline silicon.

13. The device of claim 7, in which said body comprises an alloy of non-crystalline germanium and non-crystalline silicon.

14. The device of claim 7, in which said surface is substantially flat, but for said array of projecting structural elements.

15. The device of claim 7, in which said surface is convex and curvilinear, but for said array of projecting structural elements.

16. The device of claim 15, in which said surface is cylindrical.

17. The device of claim 14, in which the projecting direction of said structural elements is substantially normal to said surface.

18. The device of claim 14, in which the projecting direction of said structural elements is at substantially the same inclination to a normal to said surface.

19. The device of claim 7, in which said semiconductor body is an element of a photothermal device.

20. The device of claim 7, in which said semiconductor body is an element of a photovoltaic cell.

21. The device of claim 7, in which said semiconductor body is a thin film.

22. The device of claim 7, in which said substrate is of metal, at least at or near interface with said semiconductor body.

23. The method of making a highly solar-energy absorbing surface on a substrate body, which comprises the controlled sputtering application of a layer of amorphous semiconductor material to an exposed-surface area of said body, and then altering the exposed-surface morphology of said layer by etching the same to form an array of outwardly projecting structural elements, the etchant being selected for the particular semiconductor material and applied in such strength and for such exposure time and ambient conditions of temperature as to form said structural elements with an aspect ratio in the range 2:1 to 10:1 and at lateral spacings which are in the order of magnitude of a wavelength within the solar-energy spectrum.

24. The method of claim 23, in which said amorphous semiconductor material is non-crystalline germanium and the etchant consists essentially of hydrogen peroxide.

25. The method of claim 24, in which the hydrogen-peroxide etchant is to the extent of a substantially 30 percent solution thereof in water.

26. The method of claim 23, in which said amorphous semiconductor material is non-crystalline silicon and the etchant consists essentially of hydrogen fluoride and nitric acid.

27. The method of claim 26, in which the proportion by volume of hydrogen fluoride to nitric acid is approximately 10:1.

28. The method of claim 27, in which said etchant further includes water dilution, to the extent that the volume proportions of nitric acid and water are substantially the same.

29. The method of claim 23, in which said etching step is one of a plurality of etching steps with different etchants.

30. The method of claim 23, in which said controlled sputtering step is one of a plurality of sputtering steps with different sputtered materials.

31. The method of claim 30, in which the etching step is performed between successive sputtering steps.

32. The method of claim 23, including the additional step of annealing at least to the extent of crystallizing said body.

33. The product of the method of claim 32.

34. The product of the method of making a highly solar-energy absorbing surface on a substrate body, which comprises the controlled sputtering application of a layer of amorphous semiconductor material to an exposed-surface area of said body, and then altering the exposed-surface morphology of said layer by etching the same to form an array of outwardly projecting structural elements, the etchant being selected for the particular semiconductor material and applied in such strength and for such exposure time and ambient conditions of temperature as to form at least a substantial fraction of said structural elements with an aspect ratio in the range 2:1 to 10:1 and at lateral spacings which are in the range of 0.2 to 2.0μ.

* * * * *